US009602083B2

(12) United States Patent
Bollapalli et al.

(10) Patent No.: US 9,602,083 B2
(45) Date of Patent: Mar. 21, 2017

(54) CLOCK GENERATION CIRCUIT THAT TRACKS CRITICAL PATH ACROSS PROCESS, VOLTAGE AND TEMPERATURE VARIATION

(71) Applicant: NVIDIA Corporation, Santa Clara, CA (US)

(72) Inventors: Kalyana Bollapalli, San Jose, CA (US); Tezaswi Raja, San Jose, CA (US)

(73) Assignee: NVIDIA CORPORATION, Santa Clara, CA (US)

(*) Notice: Subject to any disclaimer, the term of this patent is extended or adjusted under 35 U.S.C. 154(b) by 0 days.

(21) Appl. No.: 14/323,787

(22) Filed: Jul. 3, 2014

(65) Prior Publication Data
US 2015/0008987 A1 Jan. 8, 2015

Related U.S. Application Data

(63) Continuation-in-part of application No. 13/947,999, filed on Jul. 22, 2013.

(60) Provisional application No. 61/842,920, filed on Jul. 3, 2013.

(51) Int. Cl.
*H03K 3/03* (2006.01)
*G01R 31/28* (2006.01)
*G01R 31/317* (2006.01)
*H03K 3/011* (2006.01)

(52) U.S. Cl.
CPC ....... *H03K 3/0315* (2013.01); *G01R 31/2856* (2013.01); *G01R 31/31727* (2013.01); *H03K 3/011* (2013.01)

(58) Field of Classification Search
CPC .................................... H03K 3/0315

USPC ...................................... 331/57, 44
See application file for complete search history.

(56) References Cited

U.S. PATENT DOCUMENTS

| 4,958,269 | A | 9/1990 | Gritter |
| 5,690,139 | A | 11/1997 | Murphy et al. |
| 5,691,662 | A | 11/1997 | Soboleski et al. |
| 5,787,006 | A | 7/1998 | Chevallier et al. |
| 6,080,206 | A | 6/2000 | Tadokoro et al. |
| 6,111,756 | A | 8/2000 | Moresco |
| 6,157,247 | A | 12/2000 | Abdesselem et al. |
| 6,198,635 | B1 | 3/2001 | Shenoy et al. |
| 6,397,375 | B1 | 5/2002 | Block et al. |
| 6,535,071 | B2 | 3/2003 | Forbes |

(Continued)

OTHER PUBLICATIONS

Stiles, "10.3 CMOS Logic Gate Circuits", 2004, The University of Kansas, Dept. of EECS, retrieved from http://www.ittc.ku.edu/~jstiles/312/handouts/section_10_3_CMOS_Logic_Gate_Circuits_package.pdf.*

(Continued)

*Primary Examiner* — Ryan Johnson

(57) ABSTRACT

Clock generation circuit that track critical path across process, voltage and temperature variation. In accordance with a first embodiment of the present invention, an integrated circuit device includes an oscillator electronic circuit on the integrated circuit device configured to produce an oscillating signal and a receiving electronic circuit configured to use the oscillating signal as a system clock. The oscillating signal tracks a frequency-voltage characteristic of the receiving electronic circuit across process, voltage and temperature variations. The oscillating signal may be independent of any off-chip oscillating reference signal.

17 Claims, 7 Drawing Sheets

(56) References Cited

U.S. PATENT DOCUMENTS

| | | | |
|---|---|---|---|
| 6,734,744 B2* | 5/2004 | Monzel et al. ............... 331/57 |
| 6,831,494 B1 | 12/2004 | Fu et al. |
| 6,882,172 B1 | 4/2005 | Suzuki et al. |
| 6,885,210 B1 | 4/2005 | Suzuki |
| 6,898,770 B2 | 5/2005 | Boluki et al. |
| 6,903,564 B1 | 6/2005 | Suzuki |
| 6,985,025 B1 | 1/2006 | Maksimovic et al. |
| 7,024,568 B2 | 4/2006 | Maksimovic et al. |
| 7,038,483 B1 | 5/2006 | Suzuki et al. |
| 7,061,292 B2 | 6/2006 | Maksimovic et al. |
| 7,085,658 B2 | 8/2006 | Bhushan et al. |
| 7,095,288 B2 | 8/2006 | Smith |
| 7,107,200 B1 | 9/2006 | Korobkov |
| 7,126,365 B2 | 10/2006 | Suzuki |
| 7,129,763 B1 | 10/2006 | Bennett et al. |
| 7,149,903 B1 | 12/2006 | Chan et al. |
| 7,151,417 B1 | 12/2006 | Suzuki |
| 7,161,812 B1 | 1/2007 | Thomas |
| 7,212,022 B2 | 5/2007 | Suzuki |
| 7,235,998 B1 | 6/2007 | Suzuki |
| 7,281,232 B1 | 10/2007 | Nicolino, Jr. et al. |
| 7,315,178 B1 | 1/2008 | Suzuki |
| 7,330,080 B1 | 2/2008 | Stoiber et al. |
| 7,414,485 B1 | 8/2008 | Masleid |
| 7,417,482 B2* | 8/2008 | Elgebaly ............... G06F 1/3203 327/278 |
| 7,454,735 B2 | 11/2008 | Arthanari et al. |
| 7,456,628 B2 | 11/2008 | Suzuki |
| 7,467,367 B1 | 12/2008 | Li et al. |
| 7,501,868 B2 | 3/2009 | Ito |
| 7,636,023 B1 | 12/2009 | Suzuki |
| 7,642,866 B1 | 1/2010 | Masleid |
| 7,667,478 B2 | 2/2010 | Suzuki |
| 7,768,356 B2 | 8/2010 | Masleid |
| 7,774,732 B2 | 8/2010 | KleinOsowski et al. |
| 7,868,638 B2 | 1/2011 | Suzuki |
| 7,889,014 B1 | 2/2011 | Stoiber et al. |
| 8,008,961 B2* | 8/2011 | Garg ............... H03K 3/0315 327/291 |
| 8,125,261 B2 | 2/2012 | Nomura |
| 8,134,356 B2 | 3/2012 | Dobberpuhl et al. |
| 8,593,197 B1 | 11/2013 | Cheng |
| 8,624,680 B2 | 1/2014 | Stoiber et al. |
| 2002/0188920 A1 | 12/2002 | Lampaert et al. |
| 2003/0030483 A1 | 2/2003 | Seki et al. |
| 2004/0078773 A1 | 4/2004 | Sharma et al. |
| 2004/0123171 A1 | 6/2004 | Zhang et al. |
| 2005/0012556 A1 | 1/2005 | Bhushan et al. |
| 2005/0036246 A1 | 2/2005 | Nagata et al. |
| 2005/0097497 A1 | 5/2005 | Schlansker et al. |
| 2006/0031699 A1 | 2/2006 | Arthanari et al. |
| 2006/0097795 A1 | 5/2006 | Sohn |
| 2006/0156266 A1 | 7/2006 | Alpert et al. |
| 2006/0288323 A1 | 12/2006 | Birch |
| 2007/0157144 A1 | 7/2007 | Mai et al. |
| 2008/0204158 A1 | 8/2008 | Weder |
| 2009/0271752 A1 | 10/2009 | Alpert et al. |
| 2010/0019834 A1 | 1/2010 | Zerbe et al. |
| 2010/0231306 A1* | 9/2010 | Goodnow et al. ............. 331/18 |
| 2011/0161901 A1 | 6/2011 | Berry et al. |
| 2011/0199159 A1* | 8/2011 | Rozen ............... H03K 3/0315 331/74 |
| 2012/0013408 A1* | 1/2012 | Cortadella et al. ............. 331/34 |
| 2013/0152035 A1 | 6/2013 | Berry et al. |
| 2013/0311799 A1* | 11/2013 | Fitzpatrick ............ G06F 1/3296 713/320 |
| 2015/0022272 A1 | 1/2015 | Felix et al. |
| 2016/0380619 A1 | 12/2016 | Bollapalli et al. |

OTHER PUBLICATIONS

Park, Junyoung; et al. A Fast, Accurate and Simple Critical Path Monitor for Improving Energy-Delay Product in DVS Systems; IEEE; 2011; 6 pages.

* cited by examiner

CLOCK GENERATION CIRCUIT THAT TRACKS CRITICAL PATH ACROSS PROCESS, VOLTAGE AND TEMPERATURE VARIATION

RELATED CASES

This application claims priority to U.S. Provisional Patent Application No. 61/842,920, filed Jul. 3, 2013, entitled "A Clock Generator Circuit with a Tunable Frequency Output that can be Made to Match the Critical Path Frequency Across Process, Voltage and Temperature," to Bollapalli and Raja, which is hereby incorporated by reference herein in its entirety.

This application is a Continuation-in-Part of co-pending, commonly owned U.S. patent application Ser. No. 13/947,999, filed Jul. 22, 2013, entitled "Closed Loop Dynamic Voltage and Frequency Scaling," to Felix et al., which is hereby incorporated by reference herein in its entirety.

FIELD OF INVENTION

Embodiments of the present invention relate to the field of semiconductor design, manufacture, test and operation. More specifically, embodiments of the present invention relate to systems and methods for clock generation circuits that track critical path across process, voltage and temperature variation.

BACKGROUND

A semiconductor manufacturing process is generally considered to be highly self-consistent, that is, the manufacturing process is very good at producing "exact" copies of an integrated circuit design. This is especially the case for semiconductor products operated in the digital domain, for example, microprocessors and/or graphical processing units (GPUs). Functionally, the semiconductor arts have succeeded in generally producing many copies that function similarly.

Unfortunately, numerous analog characteristics of an integrated circuit are highly variable, which can lead to varied analog function/performance from circuit to circuit and/or chip to chip. For example, threshold voltage, capacitance, gate delay, current consumption, minimum operating voltage and maximum operating frequency may vary 30% or more from chip to chip of the same design utilizing nominally the same manufacturing process. In addition, once manufactured, such characteristics also vary greatly according to operating voltage and temperature. For example, an integrated circuit is generally capable of a higher operating frequency at a higher voltage and lower temperature, in comparison to operation at a lower voltage and higher temperature.

A clock signal is an oscillating electronic signal. Many complex integrated circuits, for example, microprocessors and/or graphical processing units, utilize a synchronizing signal generally known as or referred to as a clock or clock signal. Such a clock signal may be used to control and/or synchronize many aspects of an integrated circuit's operation, for example, especially that of synchronous digital circuits. The frequency of this signal is related to the performance of the integrated circuit, and is frequently utilized in advertising and as a means of comparison among similar competitive offerings, e.g., "this chip operates at 2.4 GHz."

Under the conventional art, due to the variability of the integrated circuit's operation due to manufacturing variability and operating conditions, a maximum clock frequency is typically specified by a manufacturer after qualification testing of a population of integrated circuits. A maximum clock frequency is determined to ensure reliable operation of the integrated circuit across a specified operating environment, e.g., a range of operating voltage and operating temperature, sometimes known as or referred to as an operating window or operating envelope. Once such a maximum clock frequency has been determined, a highly stable clock signal, e.g., of the maximum or lower frequency, typically derived from a crystal source, is provided to the integrated circuit for operation.

Unfortunately, since the maximum operating frequency has been determined to be satisfactory under all process variations and operating conditions, including, for example, the worst case combination of such process and operating variations, the maximum operating frequency available under the conventional art is generally less than any given integrated circuit can achieve at its actual operating conditions. Such less than optimal operation results in undesirable performance degradation of the integrated circuit, and a diminished competitive positioning of the integrated circuit.

SUMMARY OF THE INVENTION

Therefore, what is needed are systems and methods for clock generation circuits that track a critical path across process, voltage and temperature variation. What is additionally needed are systems and methods for clock generation circuits that enable improved system performance. A further need exists for systems and methods for clock generation that reduce or eliminate a need for crystal frequency references, their associated cost and space requirements. A still further need exists for systems and methods for clock generation circuits that are compatible and complementary with existing systems and methods of electronic circuit design, manufacture, test and operation. Embodiments of the present invention provide these advantages.

In accordance with a first embodiment of the present invention, an integrated circuit device includes an oscillator electronic circuit on the integrated circuit device configured to produce an oscillating signal and a receiving electronic circuit configured to use the oscillating signal as a clock. The oscillating signal tracks a frequency-voltage characteristic of the receiving electronic circuit across process, voltage and temperature variations.

In accordance with another embodiment in accordance with the present invention, an electronic circuit includes a first delay chain comprising a first type of delay element and a second delay chain comprising a second type of delay element. The second type of delay element is configured to perform a different digital function than the first type of delay element. The electronic circuit also includes combining logic configured to combine an output of the first delay chain with an output of the second delay chain to produce an oscillating signal output of the electronic circuit.

In accordance with a method embodiment of the present invention, a method includes first generating a first delay signal based on a first type of delay element and second generating a second delay signal based on a second type of delay element, different from the first type of delay element. The method also includes combining the first and second delay signals to form a clock signal that oscillates at a frequency corresponding to the longer of the first and second delay signals.

BRIEF DESCRIPTION OF THE DRAWINGS

The accompanying drawings, which are incorporated in and form a part of this specification, illustrate embodiments of the invention and, together with the description, serve to explain the principles of the invention. Unless otherwise noted, the drawings are not drawn to scale.

DETAILED DESCRIPTION

Figure 1:
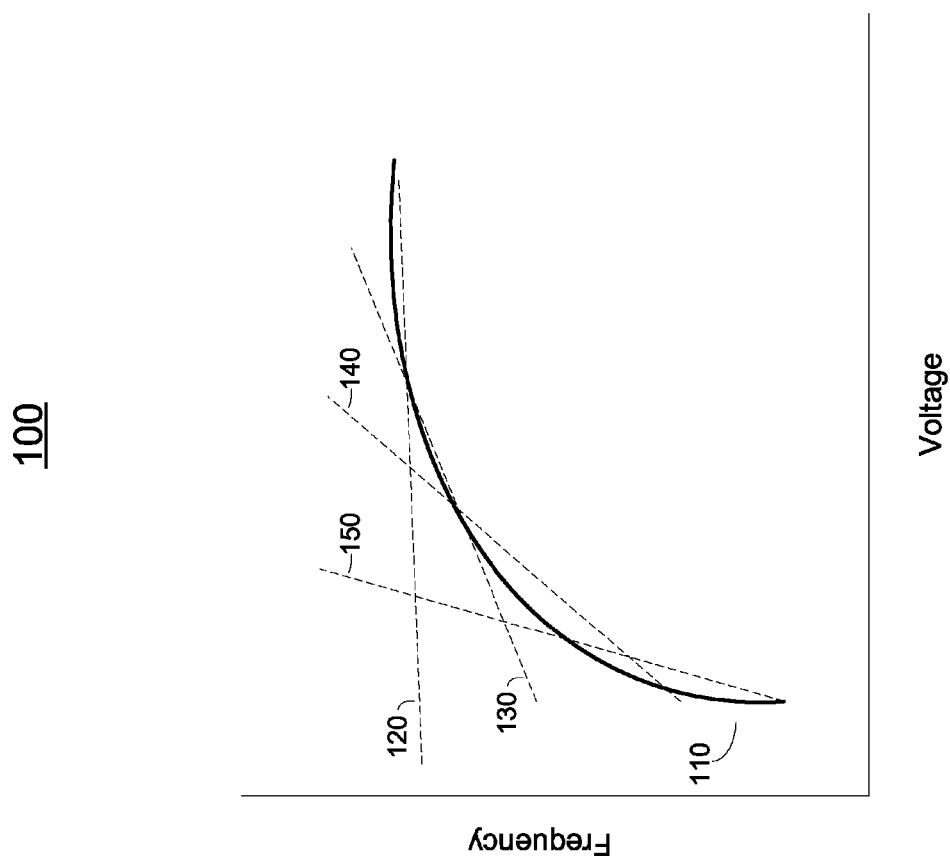
FIG. 1 illustrates an exemplary frequency versus voltage characteristic for an exemplary integrated circuit, in accordance with embodiments of the present invention.

Reference will now be made in detail to various embodiments of the present invention, examples of which are illustrated in the accompanying drawings. While the invention will be described in conjunction with these embodiments, it is understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the invention, numerous specific details are set forth in order to provide a thorough understanding of the invention. However, it will be recognized by one of ordinary skill in the art that the invention may be practiced without these specific details. In other instances, well known methods, procedures, components, and circuits have not been described in detail as not to unnecessarily obscure aspects of the invention.

Notation and Nomenclature

The term "ring oscillator" is generally used to refer to or to describe an oscillator comprising a plurality of digital gates. The most well-known configuration is an odd number of inverters, with the output of the last gate feed back into the input of the first gate, although many configurations are possible. The output frequency of a ring oscillator is a function of the number of stages and the delay, e.g., gate delay, of each stage. It is to be appreciated that not every oscillator circuit with a "ring" topology is a ring oscillator. For example, U.S. Pat. No. 6,535,071 to Forbes, describes a "phase shift oscillator" that is not a ring oscillator.

Systems and Methods for Clock Generation Circuits that Track Critical Path Across Process, Voltage and Temperature Variation In addition to the general influence of manufacturing process variation and operating conditions, the maximum clock frequency of a specific integrated circuit is limited by the timing of its most critical, e.g., slowest, path, according to its design. This circuit is generally known as or referred to as the "critical path."

In accordance with embodiments of the present invention, it is desirable to utilize a clock generating circuit that tracks an integrated circuit's critical path across process, voltage and temperature variation. Such a clock generating circuit enables higher performance when conditions allow, in comparison to the conventional art. In addition, embodiments in accordance with the present invention may reduce or eliminate a need for a crystal oscillation source, reducing the cost and volume or space requirements for such devices.

It is to be appreciated that this novel approach may produce a variable clock signal, for example, a clock signal that changes frequency according to manufacturing variations and/or operating conditions. Such a variable clock signal is in contrast to the conventional art, which has strived for a very stable, e.g., crystal-controlled, clock signal that does not vary with manufacturing variations and/or operating conditions.

In general, the term "critical path" circuit is used to refer to or to describe an electronic circuit that limits the maximum clock frequency for an entire integrated circuit device, e.g., a "chip." By way of example, a critical path circuit generally takes the longest time among all circuits to complete its operation. A critical path circuit is generally a complex circuit comprising a variety of types of gates and other sources of delay, for example, long wires. In general, the frequency versus voltage characteristic of the critical path circuit is non linear.

FIG. 1 illustrates an exemplary frequency versus voltage characteristic 100 for an exemplary integrated circuit, in accordance with embodiments of the present invention. For example, a curve on characteristic 100 represents a maximum frequency of operation for a given operating voltage for a circuit on the IC. Curve 110 illustrates an exemplary frequency-voltage characteristic of an integrated circuit, e.g., comprising the combined frequency-voltage characteristics of all elements of the integrated circuit. For example, at high frequencies, an increase in voltage produces little or no increase in maximum operating frequency. Similarly, at low voltages, the curve approaches a minimum voltage beyond which the circuit will not operate.

In accordance with embodiments of the present invention, changes in delay of a critical path are modeled by more than one delay chains. Each delay chain models the behavior of elements characteristic of a critical path circuit. In an exemplary embodiment of the present invention, changes in delay of a critical path are modeled by four delay chains. Embodiments in accordance with the present invention are well suited to delay chains (or oscillators) based on different models, and different numbers of models.

A first delay chain models changes in delay of a critical path due to wire delays. Wire-based delays generally comprise wire resistance and capacitance from interconnects. Wire delays are mostly agnostic to changes in process and voltage; however they are sensitive to parasitics, process corners and temperature. Paths dominated by wire delays are usually frequency limiters at higher operating voltage, higher temperature and fast process corners. Curve 120 illustrates an exemplary frequency versus voltage characteristic for a wire-delay model delay chain. It is appreciated that curve 120 is relatively horizontal. In general, a frequency-voltage characteristic of most electric circuits is non-linear. However, a frequency-voltage characteristic of a wire-delay model delay chain may be more linear than a frequency-voltage characteristic of a critical path circuit. Accordingly, curve 120 is illustrated as substantially linear, for clarity.

A second delay chain models changes in delay of a critical path due to simple logic gates, for example, gates having a small stack height, e.g., buffers and inverters. The delay of simple logic gates is sensitive to process and operating condition changes, but is less sensitive than complex logic gates. Paths dominated by simple gate delays are usually frequency limiters at mid to high operating voltage ranges. Curve 130 illustrates an exemplary frequency versus voltage characteristic for a simple gate-delay model delay chain. In general, a frequency-voltage characteristic of most electric circuits is non-linear. However, a frequency-voltage characteristic of a simple logic gates model delay chain may be more linear than a frequency-voltage characteristic of a critical path circuit. Accordingly, curve 130 is illustrated as substantially linear, for clarity.

A third delay chain models changes in delay of a critical path due to complex logic gates, for example, gates having three or more transistors stacked, e.g., NAND/NOR/XOR gates, transmission gates, pass gates and the like. The delay of complex logic gates is very sensitive to process and operating condition changes. Paths dominated by complex gate delays are usually frequency limiters at low to mid operating voltage ranges. Curve 140 illustrates an exemplary frequency versus voltage characteristic for a complex gate-delay model delay chain. In general, a frequency-voltage characteristic of most electric circuits is non-linear. However, a frequency-voltage characteristic of a complex logic gates model delay chain may be more linear than a frequency-voltage characteristic of a critical path circuit. Accordingly, curve 140 is illustrated as substantially linear, for clarity.

A fourth delay chain models changes in delay of a critical path due to complex structures, for example, memory structures, feedback based structures, time variant structures, non-combinatorial structures and the like. The delay of complex structures is extremely sensitive to process and operating condition changes. Paths dominated by complex structure delays are usually frequency limiters at low operating voltage ranges. Curve 150 illustrates an exemplary frequency versus voltage characteristic for a complex structure-delay model delay chain. In general, a frequency-voltage characteristic of most electric circuits is non-linear. However, a frequency-voltage characteristic of a complex structures model delay chain may be more linear than a frequency-voltage characteristic of a critical path circuit. Accordingly, curve 150 is illustrated as substantially linear, for clarity.

Figure 2:
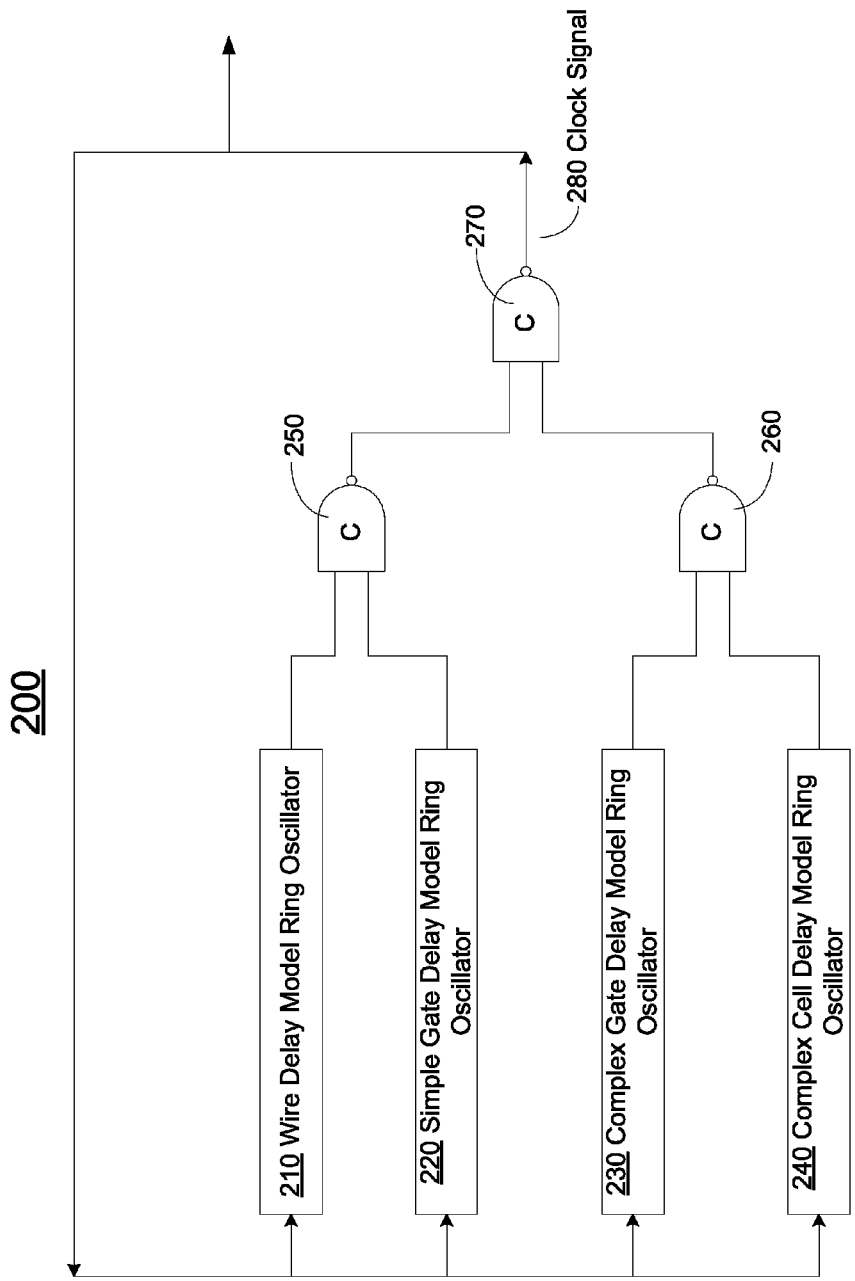
FIG. 2 illustrates an exemplary clock generation circuit that tracks critical path across process, voltage and temperature variation, in accordance with embodiments of the present invention.

FIG. 2 illustrates an exemplary clock generation circuit 200 that tracks critical path across process, voltage and temperature variation, in accordance with embodiments of the present invention. Clock generation circuit 200 comprises a plurality, e.g., four, delay chain circuits that model various delay characteristics of a critical path circuit. For example, wire delay model delay chain 210 models delays due to wires, e.g., resistance and capacitance, and related characteristics. The frequency-voltage characteristic of wire delay model delay chain 210 may generally correspond to curve 120 of FIG. 1. Simple gate delay model delay chain 220 models delays due to simple gate characteristics. The frequency-voltage characteristic of simple gate delay model delay chain 220 may generally correspond to curve 130 of FIG. 1. The frequency-voltage characteristic of complex gate delay model delay chain 230 may generally correspond to curve 140 of FIG. 1. Complex gate delay model delay chain 230 models delays due to complex gate characteristics. Complex structure delay model delay chain 240 models delays due to complex structure characteristics. The frequency-voltage characteristic of complex structure delay model delay chain 240 may generally correspond to curve 150 of FIG. 1. Control inputs, if any, to the delay chains are not illustrated for clarity.

The outputs from delay chains 210, 220, 230 and 240 are combined via coincidence detector elements 250, 260 and 270 as illustrated. In the embodiment of FIG. 2, coincidence detector elements 250, 260 and 270 comprises a "Mueller-C" element. It is appreciated that embodiments of the present invention are well suited to other types of coincidence detectors. A Mueller-C element is a well known special type of NAND gate characterized by propagating a state change only when both of its inputs agree. For example, a true NAND (or AND) gate can transition from true to false when only one of its inputs changes from true to false. In contrast, coincidence detector elements 250, 260 and 270 do not transition until all inputs agree, e.g., both inputs change from true to false.

It is to be appreciated that coincidence detector elements 250, 260 and 270 chose the slowest, e.g., lowest frequency, output from among delay chains 210, 220, 230 and 240. In this novel manner, clock signal 280 is an oscillating signal that reflects the slowest modeled frequency-voltage characteristics of a critical path circuit, and may represent a frequency that ensures that the critical path timings are met. Accordingly, embodiments in accordance with the present invention provide a clock generation circuit that tracks critical path across process, voltage and temperature variations.

In accordance with embodiments of the present invention, the exemplary individual delay chains 210, 220, 230 and 240 do not comprise internal feedback. Rather, the output of coincidence detector 270, clock signal 280, is fed back to the inputs of each of delay chains 210, 220, 230 and 240. This arrangement advantageously prevents excessive power consumption that might occur if the individual delay chains were configured as ring oscillators and allowed to run at their natural frequency. It is appreciated that embodiments in accordance with the present invention are well suited to free running ring oscillators, e.g., comprising internal feedback, and may not require feedback of combined clock signal 280.

Figure 3A:
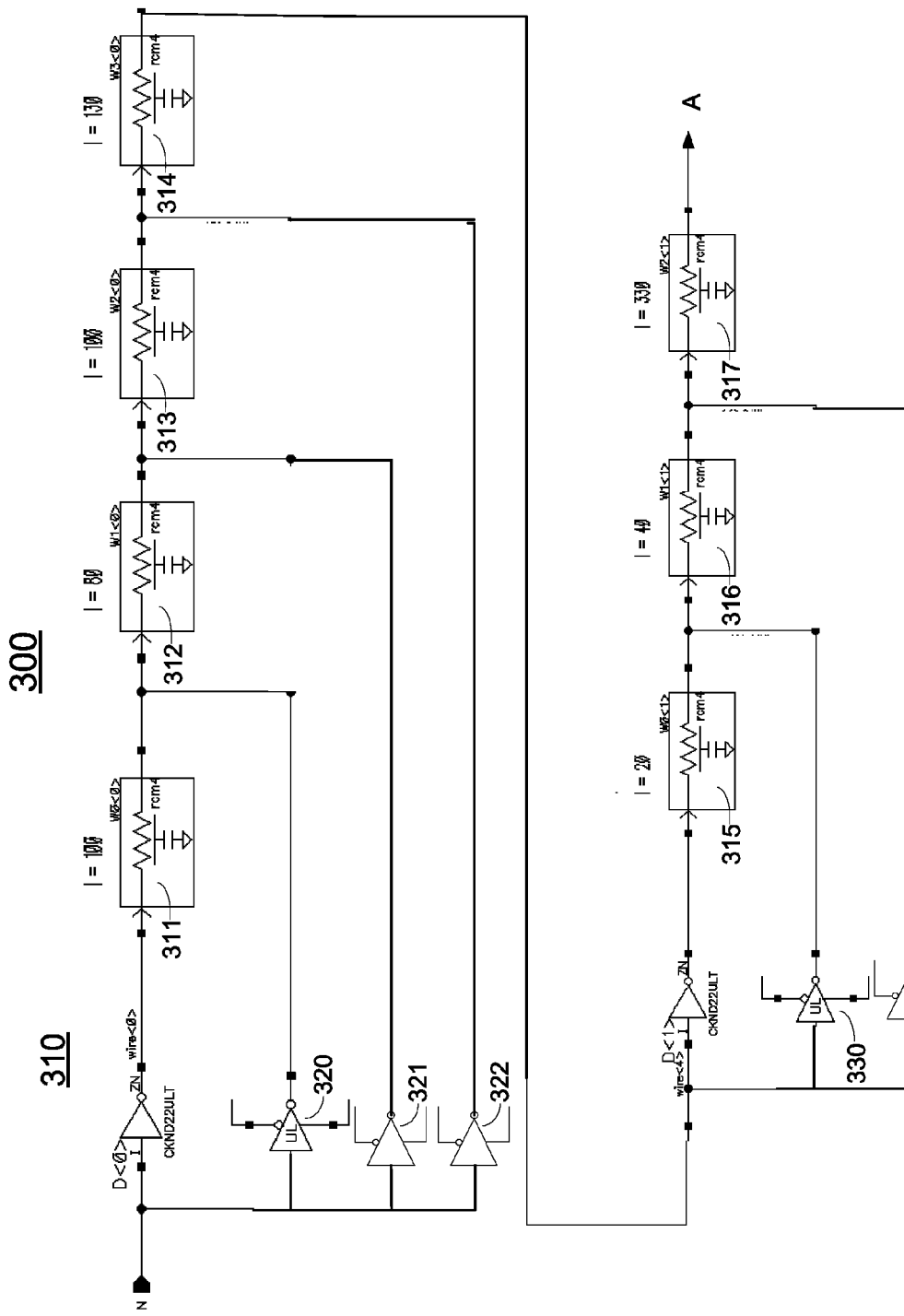
FIGS. 3A and 3B illustrate an exemplary wire delay model delay chain, in accordance with embodiments of the present invention.
Figure 3B:
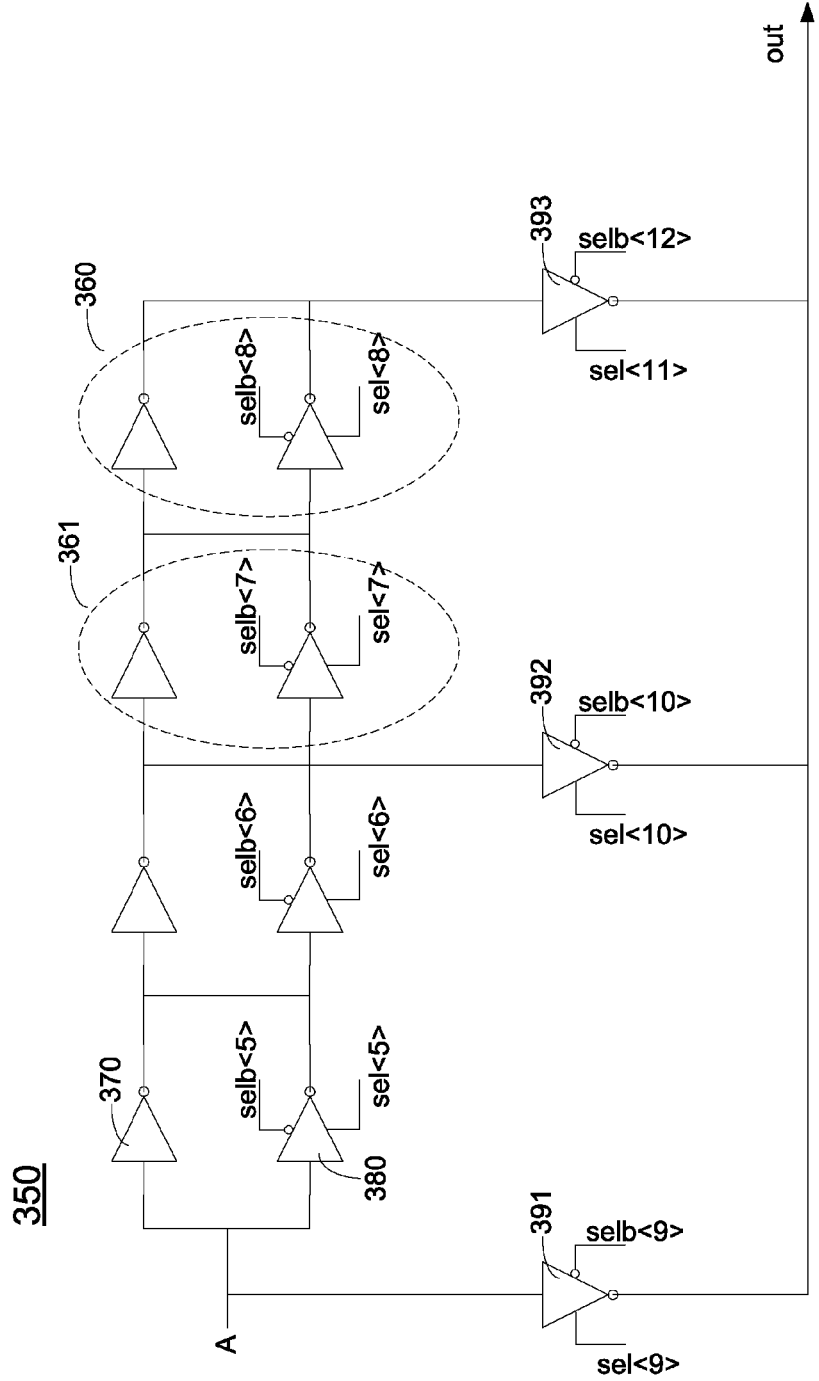

FIGS. 3A and 3B illustrate an exemplary wire delay model delay chain 300, in accordance with embodiments of the present invention. FIG. 3A illustrates a coarse adjustment or tuning delay stage 310 of wire delay model delay chain 300. Coarse tuning delay stage 310 comprises a plurality of long wires, e.g., wires 311, 312, 313, 314, 315, 316 and 317. The wires 311, 312, 313, 314, 315, 316 and 317 are generally not the same length, as indicated. Exemplary lengths are 100 nm, 80 nm, 100 nm, 130 nm, 20 nm, 40 nm and 330 nm, respectively. In this manner, a variety of wire lengths may be combined to create a coarse wire delay.

To decrease the delay through the wire, many small parallel tristatable (selectable) drivers are connected to the wire segment at various points. These parallel small drivers, when enabled, aid the signal transition through the wire and thereby act to reduce the delay when enabled. For example, turning on one of the tristatable drivers decreases a delay through a stage less than eliminating the wire. Depending on where the tristatable drivers aid the transition and how many are enabled, the delay through the wire may be adjusted by different amounts. By carefully selecting the points where parallel drivers are connected, a wide range of tunability is achieved.

For example, inverters 320, 321 and 322 represent three parallel instances of tristate (selectable) inverters/drivers, each driving outputs of wire segments 311, 312 and 313, respectively. By driving such outputs, the delay contribution of each respective wire length is reduced or eliminated. For example, tristate (selectable) inverter 320, when enabled, tends to bypass wire 311. Similarly, inverters 330 and 321 represent two parallel instances of tristate inverters/drivers, each driving outputs of wire segments 315 and 316, respectively.

FIG. 3B illustrates a fine tuning delay stage 350 of wire delay model delay chain 300, in accordance with embodiments of the present invention. Fine tuning delay stage 350 comprises a plurality of delay stages, for example, delay stage 360. Each delay stage comprises a main driver, e.g., inverter 370, coupled in parallel with a tristatable driver, e.g., tristate inverter 380. Each delay stage is operable to reduce its delay by a different amount. For example, delay stage 360 may have two delay values: a first delay value due to the inverter alone, and a second delay value when the tristatable driver is enabled, e.g., by a select ("sel") line. Enabling the tristatable driver provides extra drive strength for each fine tuning stage. It is appreciated that an increase in drive strength, e.g., the sum of drive strength of inverter 370 plus the drive strength of tristate inverter 380, decreases the delay of the delay stage. The ratio by which delay decreases, due to enabling tristatable driver(s), is dependent on the relative drive strength of the main driver verses the tristatable driver. For a given tristatable driver size, as the size of the main driver increases the percentage of delay change decreases.

In general, the delay of each delay stage of fine tuning delay stage 350 may not be equal, although that is not required. One exemplary weighting is a binary weighting relationship among delay contributions. For example, one delay stage may produce 50 percent of a maximum delay of fine tuning delay stage 350. A second stage may produce 25 percent of a maximum delay of fine tuning delay stage 350. A third stage may produce 12.5 percent of a maximum delay of fine tuning delay stage 350, and the like. Such an arrangement may enable a high granularity of delay adjustment in a decreased number of stages and devices. Linear, exponential and combination relations among delay stage weights are also contemplated, and are well suited to embodiments of the present invention. Further, the adjustment ratio delay due to the tristate driver for each stage may not be equal.

In general, the maximum delay of fine tuning delay stage 350 may be about equal to the minimum delay increment of coarse tuning delay stage 310 of wire delay model delay chain 300, although that is not required. Such an arrangement will increase the achievable granularity of delay (or frequency) available from wire delay model delay chain 300.

The outputs of all even stages of fine tuning delay stage 350 are coupled to a multiplexer comprising tristate inverter/drivers, e.g., tristate inverters 391, 392 and 393. Such multiplexing enables an increase or decrease in delay in steps of two inverter delays per step by choosing between different legs of the multiplexer. For example, enabling tristate inverter 392 tends to replace the delay of two stages of delay, e.g., stages 361 and 360, with the delay of tristate inverter 392, thereby reducing the overall delay.

In accordance with embodiments of the present invention, wire delay model delay chain 300 is independent of, for example, does not include, a multiplexer. One approach to vary delays in such a model delay chain may be to use a multiplexer to select different wire paths of different lengths. Unfortunately, such a multiplexer may tend to dominate delays in comparison to delay(s) due to wire length. In addition, the frequency-voltage characteristic of a multiplexer circuit is generally very different from the frequency-voltage characteristic of a wire. Accordingly, use of a multiplexer to select different wire paths of different lengths is ill-suited to modeling wire delays.

Figure 4:
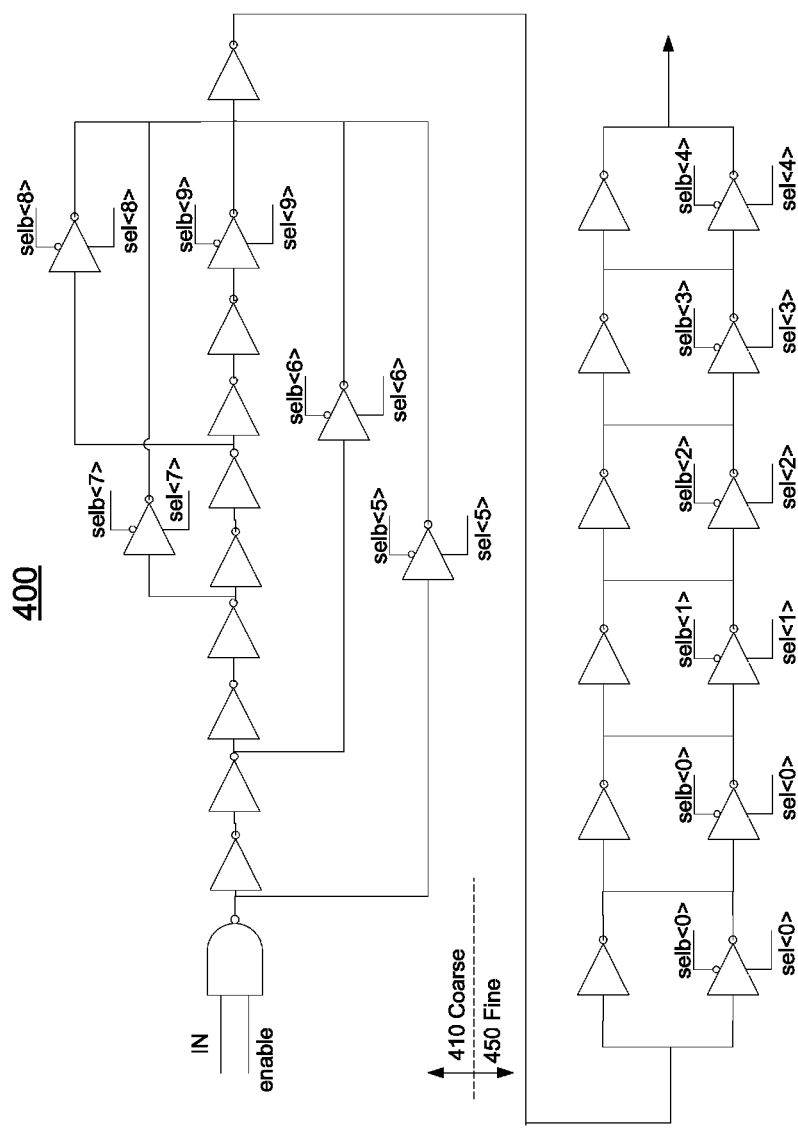
FIG. 4 illustrates an exemplary simple gate-delay model delay chain, in accordance with embodiments of the present invention.

FIG. 4 illustrates an exemplary simple gate-delay model delay chain 400, in accordance with embodiments of the present invention. Simple gate-delay model delay chain 400 comprises a coarse delay tuning stage 410 and fine delay tuning stage 450. Coarse delay tuning stage 410 comprises a long chain of inverters. The outputs of all even stages are coupled to a combiner circuit comprising tristate inverter/drivers. Such tristate combining enables an increase or decrease in delay in large (coarse) steps of two inverter delays per step by choosing between different legs of the circuit.

Fine delay tuning stage 450 comprises a plurality of delay stages comparable to those described for fine delay tuning stage 350 of FIG. 3B, enabling similar fine tuning of the overall delay of simple gate-delay model delay chain 400.

Figure 5:
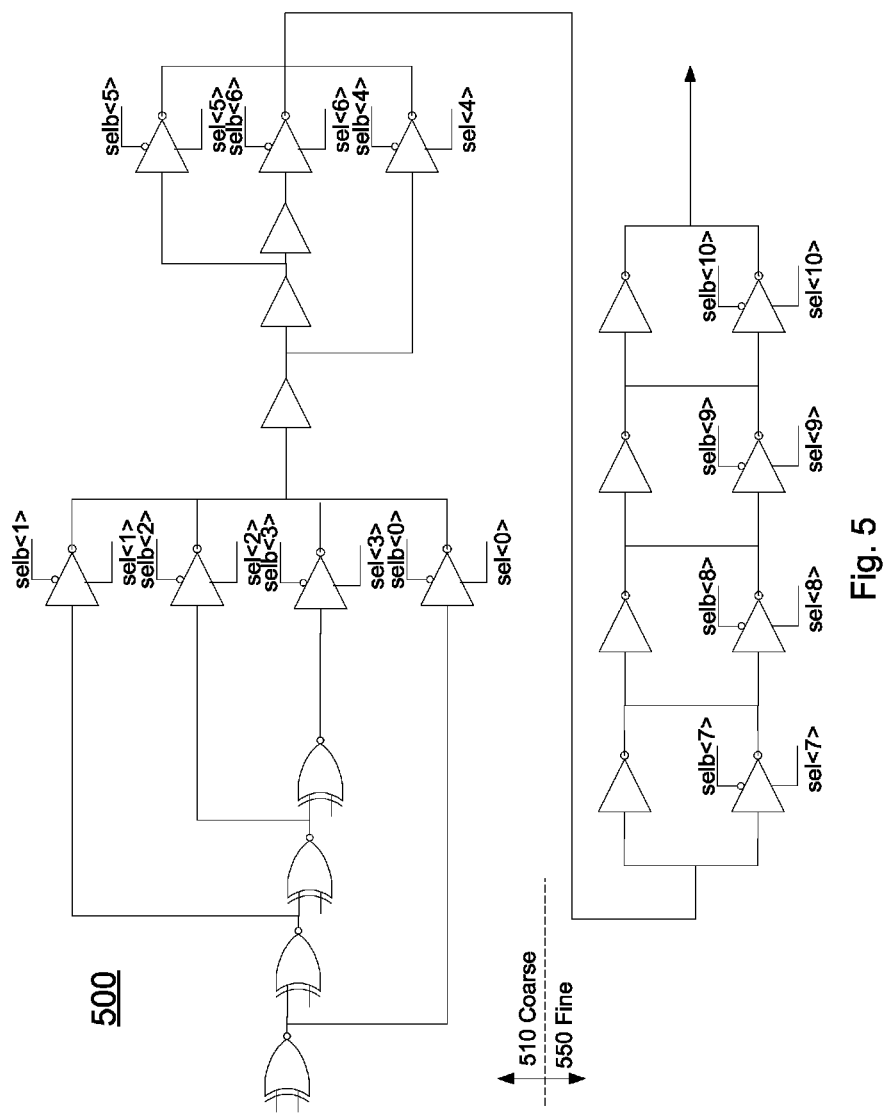
FIG. 5 illustrates an exemplary complex gate-delay model delay chain, in accordance with embodiments of the present invention.

FIG. 5 illustrates an exemplary complex gate-delay model delay chain 500, in accordance with embodiments of the present invention. Simple gate-delay model delay chain 500 comprises a coarse delay tuning stage 510 and fine delay tuning stage 550. Coarse delay tuning stage 510 comprises a long chain of XNOR (negative exclusive OR) gates coupled in series with a chain of inverters.

Each XNOR gate and inverter of coarse delay tuning stage 510 is further coupled to a multiplexer comprising tristatable inverter/drivers. Such multiplexing enables an increase or decrease in delay in large (coarse) steps by choosing between different legs of the multiplexer.

In accordance with embodiments of the present invention, the XNOR gate was selected for use in complex gate-delay model delay chain 500 due to its frequency-voltage characteristic being characterized as most sensitive to voltage from among standard gates available in a design library for a particular semiconductor technology. For example, a typical complementary metal oxide semiconductor (CMOS) XNOR gate comprises two stacks of four FETs. As previously presented, such stacked FET gates are very sensitive to process and operating condition changes, for example, due to body effects acting on the "interior" FETs. It is appreciated that other design libraries for other process nodes may have a different gate that meets such criteria. Embodiments in accordance with the present invention are well suited to the use of other complex gates.

In contrast, inverters are typically the most simple gate designs available, and are generally the least sensitive type of gate to changes in process and operating conditions. In accordance with embodiments of the present invention, the series combination of XNOR gates and inverter gates enables the frequency-voltage characteristic to be tuned in order to achieve a desired voltage sensitivity for the overall delay. For example, a ratio of the delay due to the selected XNOR gates to the delay of the selected inverters determines a desired voltage sensitivity for the overall delay. In accordance with embodiments of the present invention, the overall delay may be adjusted while holding this ratio of delays substantially constant.

Fine delay tuning stage 550 comprises a plurality of delay stages comparable to those described for fine delay tuning stage 350 of FIG. 3B, enabling similar fine tuning of the overall delay of complex gate-delay model delay chain 500.

Figure 6:
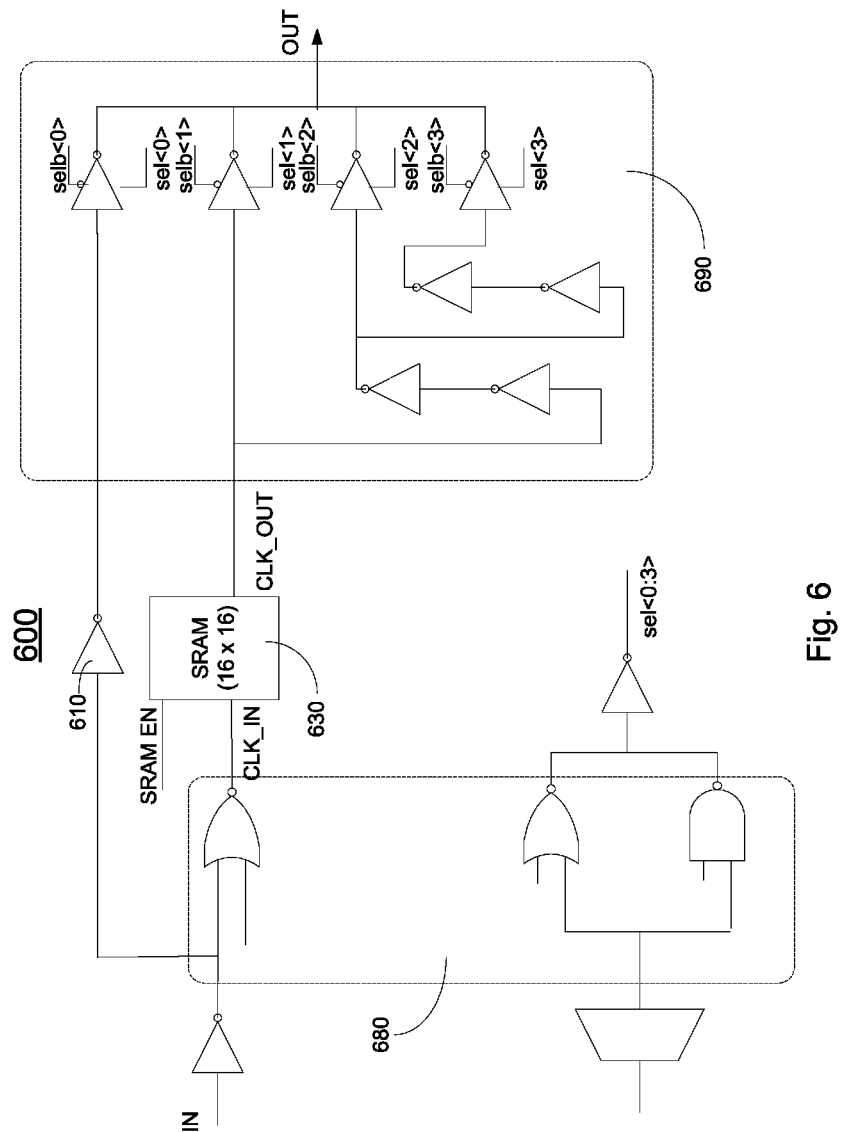
FIG. 6 illustrates an exemplary complex structure-delay model delay chain, in accordance with embodiments of the present invention.

FIG. 6 illustrates an exemplary complex structure-delay model delay chain 600, in accordance with embodiments of the present invention. Complex structure-delay model delay chain 600 is based on a static random access memory (SRAM) cell 630. In general, SRAM cell transistors are different from the typical transistors used in most digital logic, and thus may experience different manufacturing variations from other transistors on the same die. In addition, SRAM cell transistors typically operate with a higher threshold voltage in comparison to the more typical transistors used in most digital logic, for example, to reduce static leakage current. Accordingly, such SRAM cell transistors are typically slower than the more common transistors of an integrated circuit. Further, in a typical integrated circuit design process, a "slow" transistor may be replaced with a "fast" transistor in a critical path circuit, in order to improve the timing of such critical path circuit. However, this option is generally not available with an SRAM cell.

The delay of complex structures is extremely sensitive to process and operating condition changes. Paths dominated by complex structure delays usually limit operating frequency at low operating voltage ranges. An SRAM cell 630 is selected from a cell library as among the circuit blocks most sensitive to process variation and changes in operational environmental conditions. Complex structure-delay model delay chain 600 comprises a coarse delay chain 690 similar to the coarse delay tuning stage 410 of simple gate-delay model delay chain 400, as illustrated in FIG. 4. However, the complex structure-delay model delay chain 600 differs from the other delay chains in that the rising transition and the falling transition follow different paths. One transition triggers the read operation on the SRAM array 630, while the other transition triggers the pre-charge operation in pre-charge circuit 680. Tracing different paths through the delay chain results in different delays for each transition. To achieve balanced phases of the clock, the transition through the read phase is bypassed with a parallel path via inverter 610. This bypass path allows the other delay chains, e.g., delay chains 300, 400 and 500, to determine the width of one phase of the clock. In addition, the read operation self-triggers a pre-charge operation for SRAM 630. Self-triggering ensures that the total clock period is determined by the total of the read delay plus the pre-charge delay of the SRAM 630.

It is appreciated that the exemplary delay models comprise a great deal of adjustability. After characterization of a frequency-voltage characteristic of a circuit critical path, e.g., curve 110 of FIG. 1, the frequency of each delay model delay chain may be adjusted to approximate a portion of such a frequency-voltage characteristic of a circuit critical path.

In general, the types of gates comprising each individual delay model delay chain determine the "slope" of its frequency voltage characteristic. It is appreciated that, in general, such characteristics are non-linear. However, it is a convenient simplification to consider such characteristics as linear for the sake of illustration. The various adjustment settings, for example, values of the selection "sel" signals, generally determine where along the voltage axis (abscissa) the characteristic falls. It is appreciated that, for the complex-gate model delay chain, illustrated in FIG. 5, the ratio of delay due to the complex gates to the ratio of delay due to the inverters is adjustable, and such ratio influences the "slope" of that characteristic as well.

The various adjustment settings, for example, values of the selection "sel" signals for each delay model delay chain, may be permanently set, e.g., via fuses, or may be configurable at run time, in some embodiments.

It is to be appreciated that embodiments in accordance with the present invention produce an oscillating signal, suitable for use as a clock signal in complex digital logic circuits. The clock signal is produced on the same integrated circuit device, e.g., "chip," as the digital logic circuits, and may be generated from the same voltage rail as the receiving circuits. Accordingly, the clock signal is highly correlated with manufacturing variation of that integrated circuit device. For example, if the manufacturing process produces a chip that runs "slow," the oscillator will correspondingly run "slow." In addition, since the oscillating signal is produced by two or more oscillators, or delay circuits, that model different delay sources in a critical path circuit, the oscillating signal is able to track changes in operating frequency across changes in operating voltage and temperature. In this novel manner, embodiments in accordance with the present invention provide a clock generation circuit that tracks critical path across process, voltage and temperature variations.

Embodiments in accordance with the present invention provide systems and methods for clock generation circuits that track a critical path across process, voltage and temperature variation. In addition, embodiments in accordance with the present invention provide systems and methods for clock generation circuits that enable improved system performance. Further, embodiments in accordance with the present invention provide systems and methods for clock generation that reduce or eliminate a need for crystal frequency references, their associated cost and space requirements. Still further, embodiments in accordance with the present invention provide systems and methods for clock generation circuits that are compatible and complementary with existing systems and methods of electronic circuit design, manufacture, test and operation.

Various embodiments of the invention are thus described. While the present invention has been described in particular embodiments, it should be appreciated that the invention should not be construed as limited by such embodiments, but rather construed according to the below claims.

What is claimed is:
1. An integrated circuit device comprising:
an oscillator electronic circuit on said integrated circuit device configured to produce an oscillating signal,
wherein said oscillator electronic circuit comprises at least two delay chains configured to produce output signals that are configured to be combined by electronic circuits comprising a coincidence detector to produce said oscillating signal,
wherein each of said at least two delay chains comprises delay elements of a type not found in the other;
a receiving electronic circuit configured to use said oscillating signal as a clock, and
wherein said oscillating signal tracks a frequency-voltage characteristic of said receiving electronic circuit across process, voltage and temperature variations.
2. The integrated circuit device of claim 1 wherein said coincidence detector comprises a Mueller-C gate.

3. The integrated circuit device of claim 1 wherein each of said at least two delay chains models a different delay source of said receiving electronic circuit.

4. The integrated circuit device of claim 3 wherein said at least two delay chains comprise delays modeled on at least two of the set of delays characteristic to wire delays, simple-gate delays, complex-gate delays and complex structure delays.

5. The integrated circuit device of claim 1 wherein said oscillator electronic circuit is configured to produce said oscillating signal independent of any off-chip oscillating reference signal.

6. An electronic circuit comprising:
a first delay chain comprising a first type of delay element;
a second delay chain comprising a second type of delay element, wherein said second type of delay element is configured to perform a different digital function than said first type of delay element,
wherein each of said first delay chain and said second delay chain comprise delay elements of a type not found in the other; and
combining logic configured to combine an output of said first delay chain with an output of said second delay chain to produce an oscillating signal output of said electronic circuit,
wherein said combining logic comprises a coincidence detector.

7. The electronic circuit of claim 6 wherein said oscillating signal output is fed back into an input of said first and second delay chains.

8. The electronic circuit of claim 6 further comprising a third delay chain comprising a third type of delay element, wherein said third type of delay element is configured to perform a different function than said first or second types of delay element and is further configured to be combined into said oscillating signal output.

9. The electronic circuit of claim 6 wherein said combining logic comprises a Mueller-C element.

10. The electronic circuit of claim 6 wherein said first delay chain comprises a wire delay model delay chain, said wire delay model delay chain comprising:
a wire-based delay element;
a selectable driver comprising an input coupled to an input of said wire delay model delay chain and an output coupled to the output of said wire-based delay element, and
wherein enabling said selectable driver decreases a delay from said input of said wire delay model delay chain to said output of said wire-based delay element.

11. The electronic circuit of claim 6 wherein said first delay chain comprises a fine tuning section, said fine tuning section comprising:
a plurality of delay stages, each of said delay stages comprising:
a first driving element;
a selectable driving element in parallel with said first driving element, and
wherein, when enabled, said selectable driving element is configured to reduce a delay of said delay stage by less than a delay reduction corresponding to removal of said first driving element.

12. A method comprising:
first generating a first delay signal based on a first type of delay element;
second generating a delay signal based on a second type of delay element, different from said first type of delay element,
wherein said first generating and said second generating each comprise a type of delay element not found in the other; and
combining said first and second delay signals with a coincidence detector to form a clock signal that oscillates at a frequency corresponding to the longer of said first and second delay signals.

13. The method of claim 12 wherein said first and second delay signals comprise a different frequency-voltage characteristic.

14. The method of claim 12 further comprising:
feeding back said clock signal as input to said first and second generating.

15. The method of claim 12 further comprising:
adjusting a delay of said first delay signal by enabling a smaller selectable driving element configured in parallel with a larger driving element to reduce delay by less than a reduction due to removing said larger driving element.

16. The method of claim 12 wherein said second generating comprises combining delays due to gates comprising a stack of more than three transistors with delay due to gates comprising a stack of less than three transistors.

17. The method of claim 12 wherein said first and second generating are independent of a frequency reference that is substantially stable with respect to voltage.

* * * * *